US006069738A

United States Patent [19]

Cathey, Jr. et al.

[11] Patent Number: 6,069,738

[45] Date of Patent: May 30, 2000

[54] APPARATUS AND METHODS FOR EXTENDING DEPTH OF FIELD IN IMAGE PROJECTION SYSTEMS

[75] Inventors: Wade Thomas Cathey, Jr., Boulder; Edward Raymond Dowski, Jr., Lafayette, both of Colo.

[73] Assignee: University Technology Corporation, Boulder, Colo.

[21] Appl. No.: 09/307,644

[22] Filed: May 7, 1999

Related U.S. Application Data

[60] Provisional application No. 60/084,796, May 8, 1998.

[51] Int. Cl.[7] .............................. G02B 5/18; G02B 3/08; G02K 9/42

[52] U.S. Cl. .......................... 359/558; 359/738; 359/888; 359/894; 382/254; 382/255; 355/55

[58] Field of Search .................................... 359/738, 894, 359/888, 558, 370–371; 382/254, 255, 210–212; 355/53, 54, 55

[56] References Cited

U.S. PATENT DOCUMENTS 3,614,310 10/1971 Korpel .
4,804,249 2/1989 Reynolds et al. .
5,218,471 6/1993 Swanson et al. .
5,610,684 3/1997 Shiraishi .................................. 355/55
5,748,371 5/1998 Cathey, Jr. et al. .
5,969,855 3/1997 Ishiwata et al. ........................ 359/370

*Primary Examiner*—Cassandra Spyrou
*Assistant Examiner*—Fayez Assai
*Attorney, Agent, or Firm*—Jennifer L. Bales; Macheledt Bales & Johnson LLP

[57] ABSTRACT

An optical system for providing an in-focus, extended depth of field image on a projection surface includes an encoded mask or light encoder for preceding the light to include object information (or, equivalently, information about the desired image), and an extended depth of field (EDF) mask, for extending the depth of field of the projection system. In addition to including object information, the encoded mask encodes the light from the light source to account for the variations introduced by the EDF mask in extending the depth of field, so that no post processing is required.

2 Claims, 2 Drawing Sheets

APPARATUS AND METHODS FOR EXTENDING DEPTH OF FIELD IN IMAGE PROJECTION SYSTEMS

This application claims the benefit of U.S. Provisional Application No. 60/084,796, filed May 8, 1998.

Patent application Ser. No. 08/823,894, entitled "Extended Depth of Field Optical Systems" is incorporated herein by reference.

BACKGROUND OF THE INVENTION

1. Field of the Invention

The present invention relates to apparatus and methods for extending depth of field in image projection systems.

2. Description of the Prior Art

In projections systems, such as view graph projectors and lithographic projectors, the depth of focus of the projected image is often too small for the application. For example, in a view graph machine, it is often impossible to bring both the top and the bottom of the image in focus at the same time. Reducing the diameter of the lens increases the depth of field of the projected image, but results in a loss of light in the image.

In lithographic systems the depth of field problem is much more serious. Lithography utilizes a light source to project light (e.g. from a mercury arc lamp or a laser) onto a mask carrying the pattern to be transferred. The portion of light which is not blocked by the mask is focussed onto a thin film of photosensitive material (called resist) which has been deposited on the surface of the wafer. The pattern is developed on the resist.

In conventional lithographic systems, the depth of field of the focussing lens is so small that the wafer must be level and smooth to within a small fraction of a micrometer. This is very difficult to achieve. If the wafer thickness varies slightly or if the wafer is not perfectly seated, portions of the pattern image are not in focus.

One method which has been used to increase the depth of field of the pattern image is to decrease the diameter of the lens aperture, but this decreases the resolution of the image, as well as resulting in a loss of light. Resolution especially is of major importance in lithography.

In patent application Ser. No. 08/823,894, entitled "Extended Depth of Field Optical Systems" (incorporated herein by reference), methods and apparatus were disclosed which increase the depth of field of an image by providing an Extended Depth of Field (EDF) mask in the imaging system combined with post processing of the captured image. The EDF mask modifies the optical transfer function of the imaging system to be insensitive to the distance between the object and the imaging system. The post processing reverses the mask modifications. This method is not useful in projection systems, because it is not practical to provide post processing of the projected image.

A need remains in the art for apparatus and methods which extend depth of field in image projection systems.

SUMMARY OF THE INVENTION

In patent application Ser. No. 08/823,894, entitled "Extended Depth of Field Optical Systems," methods and apparatus were disclosed which increase the depth of field of an image of any unknown object by providing an Extended Depth of Field (EDF) mask in the imaging system and post processing of the captured image. This method is not useful in projection systems, because it is not practical to provide post processing of the projected image. However, projection systems are different from other types of imaging systems, in that the desired image is known in advance. The inventors of the present invention have discovered that preprocessing, or coding, of the light passing through the imaging system may be substituted for post processing of the image, to increase the depth of field of the projected image.

The encoded mask accomplishes two functions: it includes the information from the object, and it also accounts for the variations in the image which is inevitably introduced by the EDF mask. Therefore, the image at the projection surface is in focus, and also has an extended depth of field, without requiring preprocessing.

DETAILED DESCRIPTION OF THE PREFERRED EMBODIMENT

In patent application Ser. No. 08/823,894, by the present inventors, entitled "Extended Depth of Field Optical Systems", an invention was described which increases the depth of field of an image. A mask in the imaging path modifies the optical transfer function of the imaging system to be insensitive to the distance between the object and the imaging system. The image quality is then uniformly poor over the depth of field. Post processing of the image compensates for the mask modifications, restoring image quality, but retaining the increased depth of field. This invention is not useful in increasing the depth of field of projected images provided by projection systems, because it is not practical to provide post processing of the projected image.

However, projection systems such as lithographic systems have an unusual feature compared to other imaging systems: the desired image is known in advance. Given this advantage, the inventors of the present invention have discovered a way to preprocess, or encode, the light which passes through the modified projector imaging system. This encoding, or preprocessing, takes the place of the post processing in the above mentioned patent application, so that the projected image has an increased depth of field, without requiring post processing. The projection system is modified to have an extended depth of field.

Figure 1:
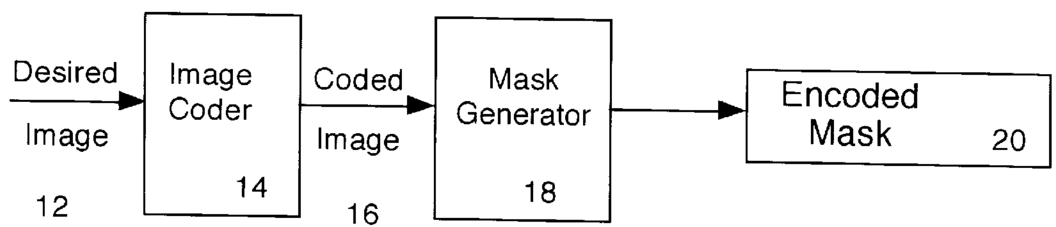
FIG. 1 shows a block diagram of the process according to the present invention by which an encoded mask is fabricated based upon the image to be projected.

FIG. 1 shows a block diagram of the process by which an encoded mask 20 is fabricated based upon the desired image to be projected 12, and the known characteristics of the modified projection system. Based upon the known desired image 12 (in the form of a stored array of electronic data, for example), image coder 14 does the required digital signal processing to generate coded data representing the coded image 16. Coded image 16 is provided to mask generator 18, which generates an optical mask 20 which will encode light passing through it based upon the coded image 16.

The technique used to generate masks 32 and 332 (shown in FIGS. 2 and 3 respectively) is similar to the technique taught in patent application Ser. No. 08/823,894, described above. That application taught a method for extending the depth of field of an optical system, using a mask to make the optical transfer function of the system relatively insensitive to the distance of the object from the system, and including post processing to remove the effects of the mask. This signal processing was required, because the optical system had a large depth of field, but the image had poor quality. The signal processing restored the image quality, so that the resulting image had both a large depth of field and good image quality.

In projection systems according to the present invention, the same, or similar modifications are made to the optical system, but no signal post processing is possible. Therefore, in essence the object is modified instead, by passing the projection light through encoded mask 20, prior to extending the depth of field with EDF mask 32 or 332. This is possible because the object (or equivalently, the desired image) is known in advance. In the case of lithography, the cost of preparing a modified object is negligible compared to the cost of preparing the wafers and the multi-million dollar cost of the projection system.

In an incoherent imaging system (one with illumination that has a broad spectrum of wavelengths, and does not come from a point source, or cannot be focussed to a point) the image formed can be described as:

$I(x,y)=h(x,y)*O(x,y)$, where * denotes convolution $I(x,y)$ is the image distribution, $h(x,y)$ is the impulse, or point object response, and $O(x,y)$ is the object distribution In the above referenced patent application covering an extended depth of field imaging system, a family of functions were described which cause the impulse response of the optical system to be relatively insensitive to the object distance, meaning that object distances which would normally result in misfocus, instead result in an in focus image (after post processing). The family of functions were based upon cubic functions (though other functions may also be used).

That is, an optical element must introduce a phase shift across the aperture of the optical system where the phase varies as a cubic. For example, the phase across the aperture could vary as:

$\phi(x,y)=\alpha(x^3+y^3)$, where $\phi(x,y)$ is the phase change introduced, and $\alpha$ is a constant chosen for desired depth of field and available signal processing.

Note that for constant index of refraction materials where the index is higher than the surrounding medium, the phase change introduced is proportional to the thickness of the material at that point.

The same family of functions can be used for the EDF mask in the projection systems of the present invention, but the light from the object must be precoded prior to passing through imaging system with the cubic mask. To get a desired image in a projection system when the impulse response is invariant with misfocus, denoted by $h_c(x,y)$, the object must be modified to be:

$$h_c(x,y)*0_m(x,y)=0(x,y)$$

This modified object, when imaged with the previously disclosed extended depth of field system, will project onto a screen, silicon wafer, or other surface with an extended depth of focus that is dependent upon the phase depth of mask 20. In addition to the desired image, there will be an additional bias on the image that has a level that depends on, among other variables, the degree of coherence of the illumination and the accuracy with which the encoded mask is made.

Many illumination systems are not completely incoherent, but provide partially coherent illumination. In this case, there is an effective impulse response that is a function of the degree of coherence, and this effective impulse response must be used in the production of encoded mask 20.

Figure 2:
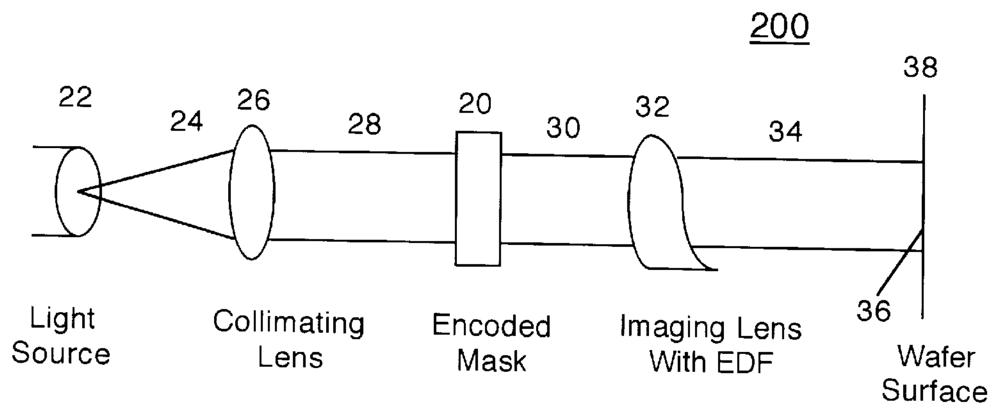
FIG. 2 shows a first embodiment of apparatus for forming an extended depth of field projected image using the encoded mask of FIG. 1.

FIG. 2 shows apparatus 200 for forming an extended depth of field projected image 36 using coded mask 20, formed as shown in FIG. 1. The apparatus of FIG. 2 is particularly useful in lithography applications, as the desired image is known in advance and a physical encoded mask 20 can be built in advance as well. Light source 22 provides light 24, which is collimated by lens 26. Collimated light 28 passes through encoded mask 20, and is encoded as described above in conjunction with FIG. 1. Encoded light 30 then passes through EDF mask 32, which extends the depth of field of system 200. Its other effects on the image, which would normally reduce the quality of the image, have already been accounted for by encoded mask 20. Thus, light 34 forms an in focus, extended depth of field image 36, upon surface 38.

Figure 3:
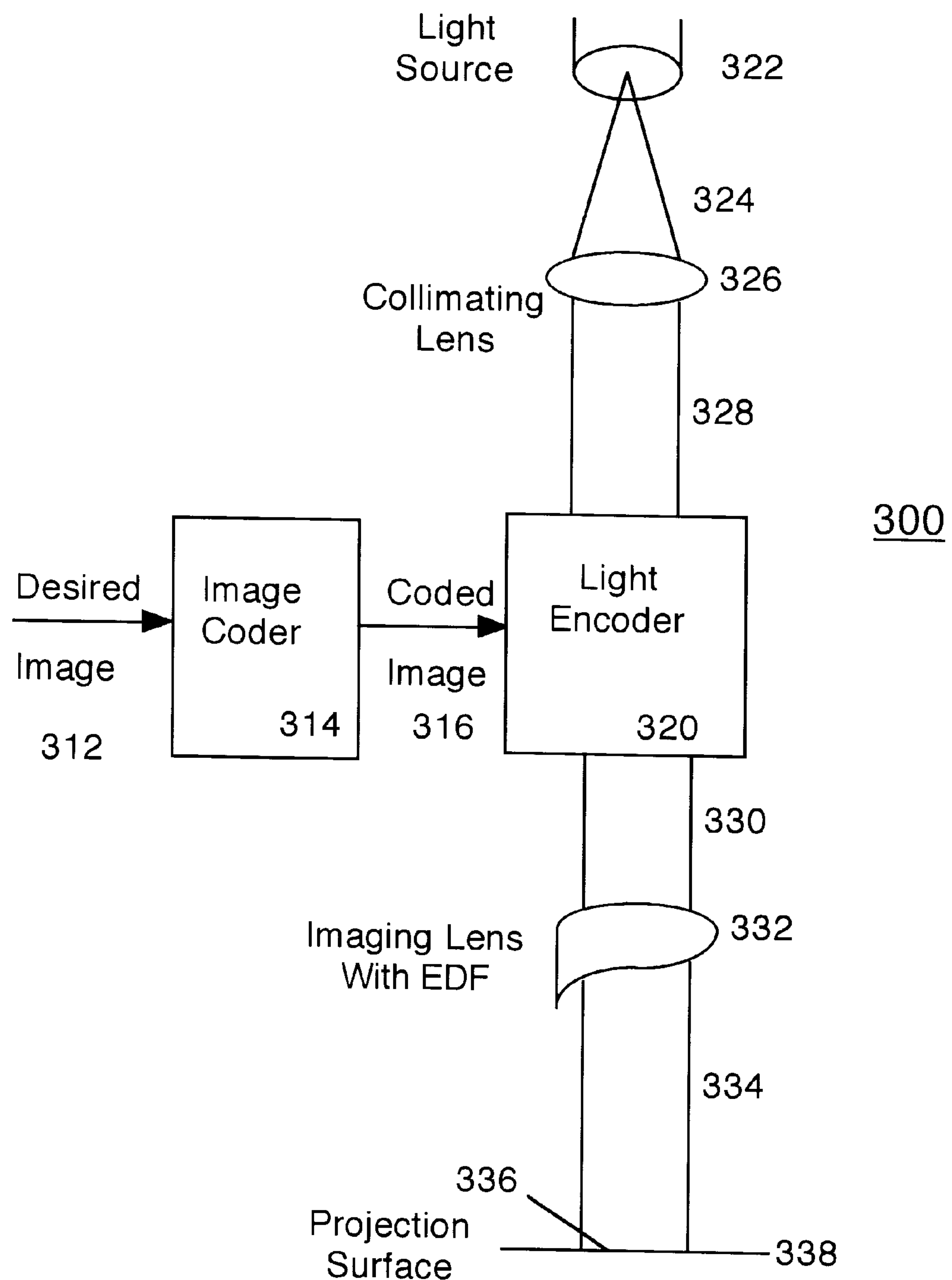
FIG. 3 shows a second embodiment of apparatus for forming an extended depth of field projected image, wherein the encoded mask is implemented in real time by a light encoder.

FIG. 3 shows apparatus 300 for forming an extended depth of field projected image 336, wherein the coded mask is implemented in real time (or perhaps at a slower rate) by a light encoder 320. This embodiment is useful for applications wherein the object (or desired image) is changing over time, and significant processing power is available to determine the light precoding required for the image on the fly.

The desired image 312 is provided in real time to image coder processor 314. Image coder 314 is similar image coder 14 of FIG. 1, except that it operates on an ongoing basis. Coded image 316 is provided to light encoder 320, which provides the function of encoded mask 20, and encodes light 328 to provide encoded light 330. Light encoder 320 may be implemented as a spatial light modulator, for example.

Light source 322 provides light 324, which is collimated by lens 326. Collimated light 328 passes through light encoder 320, and is encoded as described above. Encoded light 330 then passes through EDF mask 332, which extends the depth of field of system 300. Its other effects on the image, which would normally reduce the quality of the image, have already been accounted for by light encoder 320. Thus, light 334 forms an in focus, extended depth of field image 336, upon projection surface 338.

While the exemplary preferred embodiments of the present invention are described herein with particularity, those skilled in the art will appreciate various changes, additions, and applications other than those specifically mentioned, which are within the spirit of this invention.

What is claimed is:

1. An image projecting system comprising:

a source of light;

a projection surface;

a light encoder between the light source and the projection surface; and an extended depth of field (EDF) mask between the light source and the projection surface;

wherein the EDF mask is constructed and arranged to cause variations in a wavefront of light passing through the mask, wherein the variations in the wavefront result in an altered optical transfer function of the image projection system that is substantially less sensitive to the distance between the light encoder and the projection surface than the optical transfer function of the image projection system without the EDF mask; and wherein the light encoder encodes the light with information related to a desired image and to account for variations introduced by the EDF mask, such that the light passing through the EDF mask and the light encoder forms the desired image at the projection surface.

2. A method of increasing depth of field in an image projecting system having a light source and a projection surface, comprising the steps of:

extending the depth of field of the light from the light source; and encoding the light with information related to a desired image and to account for variations introduced by the step of extending the depth of field;

such that the light forms the desired image at the projection surface.

* * * * *